United States Patent [19]
Suzuki et al.

[11] Patent Number: 5,970,019
[45] Date of Patent: Oct. 19, 1999

[54] SEMICONDUCTOR MEMORY DEVICE WITH ROW ACCESS IN SELECTED COLUMN BLOCK

[75] Inventors: Takaaki Suzuki; Shinya Fujioka, both of Kawasaki, Japan

[73] Assignee: Fujitsu Limited, Kawasaki, Japan

[21] Appl. No.: 09/035,101

[22] Filed: Mar. 5, 1998

[30] Foreign Application Priority Data

Jun. 30, 1997 [JP] Japan .................................. 9-174580

[51] Int. Cl.⁶ .................................................. G11C 8/00
[52] U.S. Cl. ................................. 365/230.06; 365/230.03
[58] Field of Search ....................... 365/230.03, 230.06, 365/230.08, 189.05, 189.07, 222, 238.5

[56] References Cited

U.S. PATENT DOCUMENTS

| | | | |
|---|---|---|---|
| 4,691,303 | 9/1987 | Churchward et al. | 365/222 |
| 4,758,993 | 7/1988 | Takemae | 365/222 |
| 4,958,326 | 9/1990 | Sakurai | 365/218 |
| 5,193,074 | 3/1993 | Anami | 365/230.03 |
| 5,553,026 | 9/1996 | Nakai et al. | 365/230.03 |
| 5,761,149 | 6/1998 | Suzuki et al. | 365/230.03 |
| 5,822,264 | 10/1998 | Tomishima et al. | 365/230.03 |
| 5,835,436 | 11/1998 | Ooishi | 365/230.03 |
| 5,841,727 | 11/1998 | Iwanari et al. | 365/230.03 |
| 5,848,006 | 12/1998 | Nagata | 365/230.06 |

Primary Examiner—Tan T. Nguyen
Assistant Examiner—Gene N. Auduong
Attorney, Agent, or Firm—Nikaido, Marmelstein, Murray & Oram LLP

[57] ABSTRACT

A semiconductor memory device which employs a hierarchical word-decode scheme for word selection includes sub-word lines provided for each of column blocks, a control circuit selecting one of the column blocks corresponding to a currently accessed column address in a first case where a currently accessed row address is different from a successively accessed row address, and selecting all of the column blocks in a second case where the currently accessed row address is the same as the successively accessed row address, and a sub-word decoder selectively activating the sub-word lines with respect to all of one or more column blocks selected by the control circuit.

9 Claims, 11 Drawing Sheets

SEMICONDUCTOR MEMORY DEVICE WITH ROW ACCESS IN SELECTED COLUMN BLOCK

BACKGROUND OF THE INVENTION

1. Field of the Invention

The present invention generally relates to semiconductor memory devices, and particularly relates to a semiconductor memory device which employs a hierarchical word-decode scheme.

2. Description of the Related Art

The hierarchical word-decode scheme employs a hierarchical structure of word lines in which two types of word lines, i.e., main-word lines and sub-word lines, are used for word selection. A typical material used for word lines is polysilicon. Unfortunately, polysilicon has a relatively high resistance for wiring material, causing a significant delay to signals propagating therethrough. A conventional technique to counter this is to establish contact at predetermined intervals between polysilicon word lines and aluminum wiring lines arranged in parallel to the polysilicon word lines, thereby reducing a resistance of the word lines. In order to increase circuit density, however, intervals between the wiring lines needs to be shortened, but it is difficult to implement a pattern of aluminum wiring lines having the same pitch as polysilicon wiring lines. The hierarchical word-decode scheme obviates this problem by dividing polysilicon word lines into sub-word lines having tolerable delays and by using aluminum for main-word lines to achieve sufficiently small delays.

Figure 1:
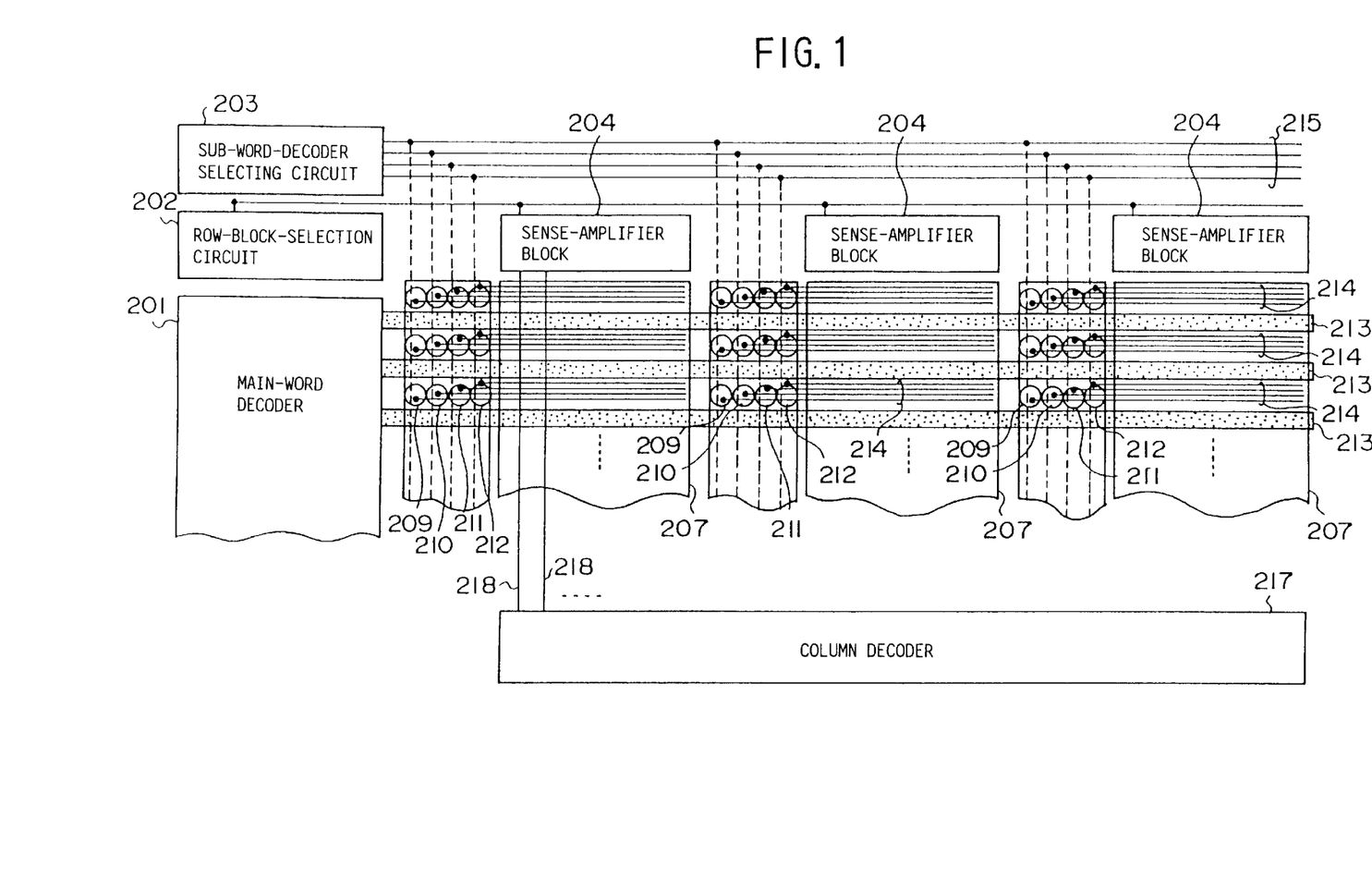
FIG. 1 an illustrative drawing showing a word-line structure according to a related-art hierarchical word-decode scheme.

FIG. 1 is an illustrative drawing showing a word-line structure according to a related-art hierarchical word-decode scheme. A main-word decoder 201 decodes a row address to select one of main-word lines 213, and turns the selected main-word line to HIGH. The main-word lines 213 are provided on a wiring layer. In a different wiring layer, four sub-word lines 214 are laid out generally under the main-word lines 213. The sub-word lines 214 are connected to four types of sub-word decoders 209 through 212, respectively. The sub-word decoders of the same type are arranged in a row perpendicular to the extension of the main-word lines 213.

A sub-word-decoder selecting circuit 203 selects one type of sub-word decoder from the four types of the sub-word decoders 209 through 212 via the sub-word-decoder selection lines 215. The selected type of the sub-word decoders connects the main-word lines 213 to the sub-word lines 214. As a result, only one of the four sub-word lines 214 connected to the selected one of the main-word lines 213 becomes HIGH when this sub-word line 214 is selected by the sub-word-decoder selecting circuit 203. This achieves a hierarchical word selection. In the case of data-read operations, for example, data stored in memory-cell arrays 207 is read by sense amplifiers of sense-amplifier blocks 204 only with respect to the selected word.

The memory-cell arrays 207 are arranged in a plurality of column blocks along a column direction (horizontal direction in the figure) as well as in a plurality of row blocks along a row direction (vertical direction in the figure). FIG. 1 only shows a configuration of one row block. This row block is selected when a row-block-selection circuit 202 selectively operates the sense-amplifier blocks 204 of his row block. In general, all the sense-amplifier locks 204 are operated with respect to a selected row lock.

The operation described above is generally referred to as a RAS (row address strobe) operation. Following this RAS operation, a CAS (column address strobe) operation is performed to read data from the semiconductor memory device. That is, a column decoder 217 selectively activates one of the column-selection lines 218 corresponding to an indicated column address so as to select a sense amplifier from one of the sense-amplifier blocks 204, thereby allowing data to be read from the selected sense amplifier.

In semiconductor devices, it is preferable to reduce power consumption as much as possible. In order to meet this demand, a column address may be supplied by the time a row access is performed, so as to allow sense amplifiers to operate only with respect to a column block of a selected column address.

Figure 2:
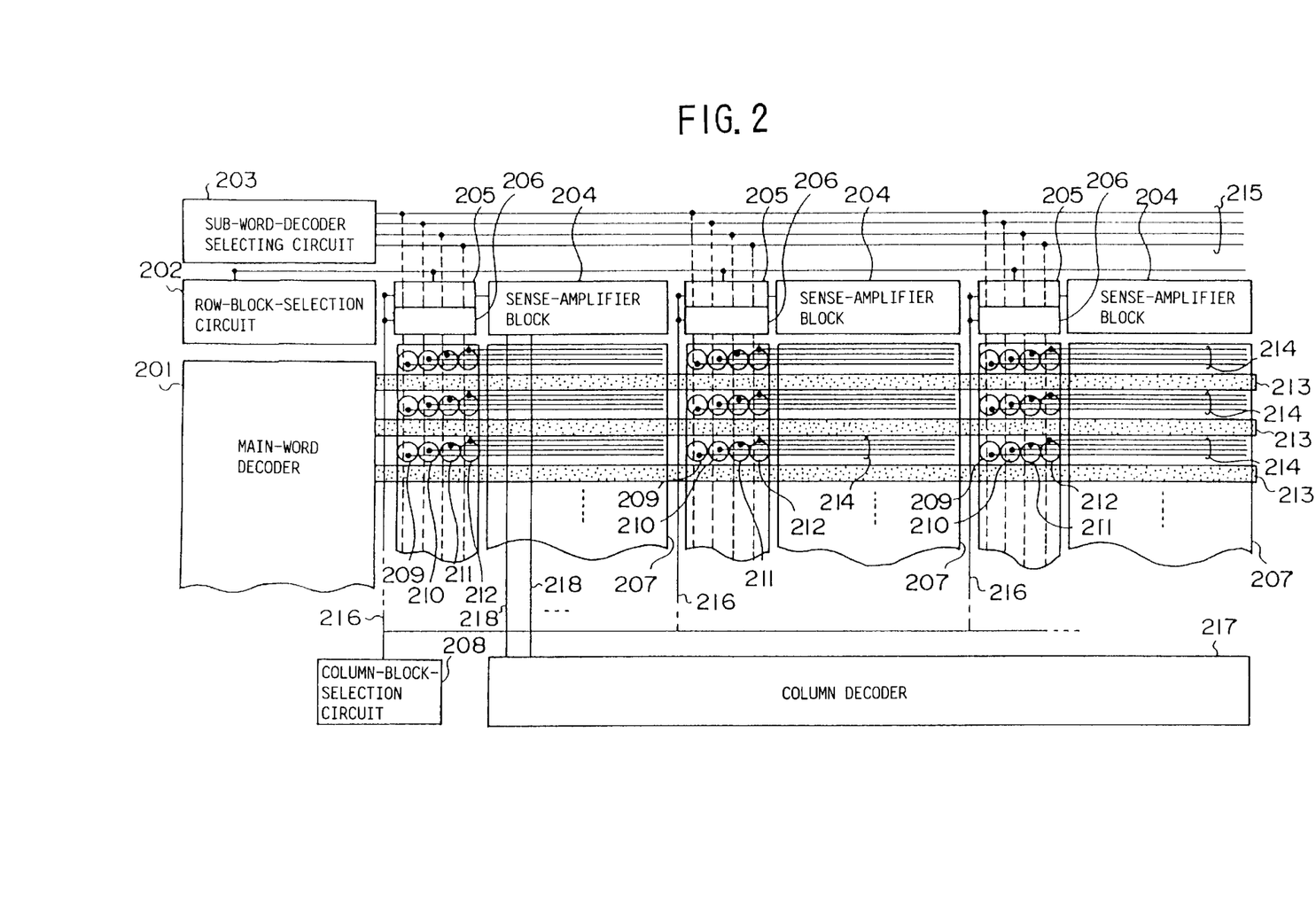
FIG. 2 is an illustrative drawing showing a configuration which activates only a selected column block in the hierarchical word-decode scheme.

FIG. 2 is an illustrative drawing showing a configuration which activates only a selected column block in the hierarchical word-decode scheme.

In the configuration of FIG. 2, all the sense-amplifier blocks 204 are not driven, but only one of the sense-amplifier blocks 204 is operated with respect 20 to a selected column address. A column-block-selection circuit 208 is provided for this purpose.

Before a row access is performed, a column address is supplied to the device, and the column-block-selection circuit 208 selects a column block corresponding to an indicated column address. Column-block-selection lines 216 extend from the column-block-selection circuit 208, and are connected to sense-amplifier-control circuits 205 and sub-word-decoder-control circuits 206. The sense-amplifier-control circuits 205 drive only one of the sense-amplifier blocks 204 selected by the column-block-selection circuit 208 in a selected row block when the row-block-selection circuit 202 selects this row block. The sub-word-decoder-control circuits 206 supply selection signals from the sub-word-decoder selecting circuit 203 to the sub-word decoders 209 through 212 only in the column block selected by the column-block-selection circuit 208.

In this manner, data access is made to a memory-cell array 207 of a selected column with respect to a selected row block, and one of the sense-amplifier blocks 204 is operated only with respect to the selected column block. This achieves a reduction in the operation load of the circuits relating to the RAS operation, and, at the same time, achieves a reduction in power consumption.

When the RAS operation is performed by the unit of a column block as shown in FIG. 2, however, a speed limit is placed on the CAS operation. In the configuration of FIG. 1, the sub-word lines 214 are selectively activated with respect to all the column blocks, and the sense-amplifier blocks 204 are activated for all the column blocks. As long as successive accesses are made to the same row address, data can be consecutively read from different column addresses of the sense-amplifier blocks 204 by successively selecting the column-selection lines 218. In the configuration of FIG. 2, on the other hand, each time data is read from a column block, a selective activation needs to be performed with respect to the main-word lines 213 and the sub-word lines 214. That is, the RAS operation is necessary at every turn even when the same row address continues to be accessed.

Even though the RAS operation in the configuration of FIG. 2 has a greater speed than the RAS operation of FIG. 1 because of the column-block-wise access, there is a need to carry out the RAS operation each time a column block is accessed. The configuration of FIG. 2 thus suffers a reduction in operation speed when a total of the RAS operation and the CAS operation is taken into consideration, compared to the configuration of FIG. 1.

Accordingly, there is a need for a semiconductor memory device which can achieve a high speed operation while performing column-block-wise access to reduce power consumption.

SUMMARY OF THE INVENTION

Accordingly, it is a general object of the present invention to provide a semiconductor memory device which can achieve the need described in the above.

It is another and more specific object of the present invention to provide a semiconductor memory device which can achieve a high speed operation while performing column-block-wise access to reduce power consumption.

In order to achieve the above objects according to the present invention, a semiconductor memory device which employs a hierarchical word-decode scheme for word selection includes sub-word lines provided for each of the column blocks, a control circuit selecting one of the column blocks corresponding to a currently accessed column address in a first case where a currently accessed row address is different from a successively accessed row address, and selecting all of the column blocks in a second case where the currently accessed row address is the same as the successively accessed row address, and a sub-word decoder selectively activating the sub-word lines with respect to all of one or more column blocks selected by the control circuit.

In the semiconductor memory device described above, when successive accesses are directed to the same row address, all the column blocks are selected, and the-sub-word lines are activated with respect to all the column blocks. Therefore, only one activation of the RAS operation makes it possible to consecutively access different column addresses at the same row address, thereby enhancing an operation speed.

According to one aspect of the present invention, two types of row-access commands are provided to make an easy check as to whether successive accesses are directed to the same row address.

According to another aspect of the present invention, when successive accesses are directed to the same row address, all the column blocks are selected, and the sub-word lines are activated with respect to all the column blocks with a special handling of a first accessed column block, where the sub-word lines are activated ahead of other sub-word lines in the other column blocks. Only one activation of the RAS operation makes it possible to consecutively access different column addresses at the same row address, thereby enhancing an operation speed. Further, the first sub-word lines can be activated at a relatively high speed because of a relatively small load on the circuits, thereby boosting an operation speed.

According to another aspect of the present invention, a reset operation is automatically activated inside the device without needing an externally provided precharge command, and an automatic reset operation for main-word lines is stopped when access is successively made to the same row address. Therefore, there is no need to activate the main-word lines at every turn.

According to another aspect of the present invention, a check can be made as to whether successive accesses are directed to the same row address by comparing a previous row address and a current row address.

According to another aspect of the present invention, a selected one of the main-word lines is deactivated concurrently with activation of a next selected one of the main-word lines.

Other objects and further features of the resent invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 3:
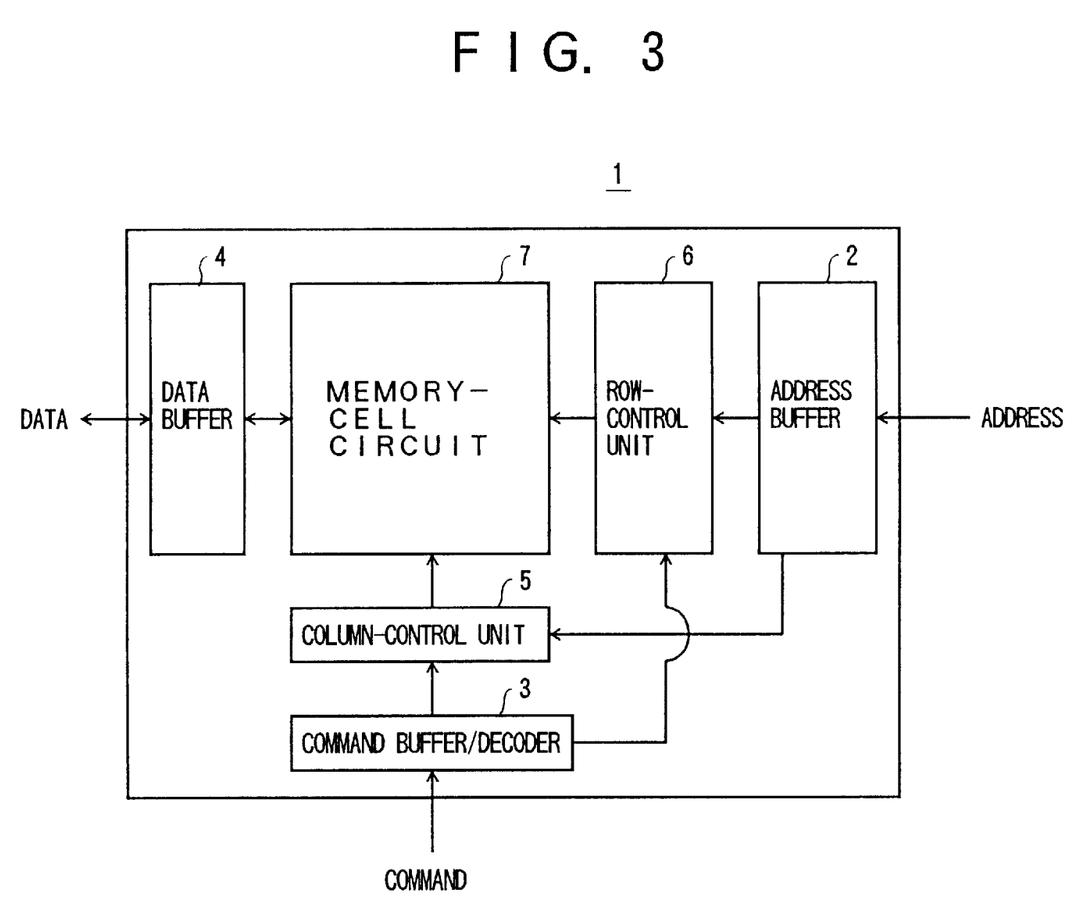
FIG. 3 is a schematic block diagram of a semiconductor memory device such as a DRAM or an SDRAM according to the present invention.

FIG. 3 is a schematic block diagram of a semiconductor memory device such as a DRAM or an SDRAM according to the present invention.

A semiconductor memory device 1 of FIG. 3 includes an address buffer 2, a command buffer/decoder 3, a data buffer 4, a column-control unit 5, a row-control unit 6, and a memory-cell circuit 7.

The address buffer 2 receives an address input, and supplies a row address and a column address to the row-control unit 6 and the column-control unit 5, respectively. The command buffer/decoder 3 receives a command input, and decodes the contents of the command input. Based on the decoding results of the command buffer/decoder 3, the column-control unit 5 and the row-control unit 6 are controlled. The memory-cell circuit 7 includes a memory-cell array, main-word lines, sub-word lines, bit lines, sense amplifiers, etc.

The row-control unit 6 controls the RAS operation. The row-control unit 6 selects and activates a main-word line and a sub-word line corresponding to an indicated row address to effect a data exchange between corresponding memory cells and sense amplifiers. In the semiconductor memory device 1, a column address is already available when the row-control unit 6 performs a row-address access. By referring to this column address, the column-control unit 5 selects a column block corresponding to the indicated column address. In the selected column block, the row-control unit 6 performs the RAS operation. Namely, sense amplifiers are driven and sub-word lines are activated by the row-control unit 6 only within the selected column block.

A column block (or a cell block) in the present invention refers to a range of column addresses which are accessed by a single segment of a sub-word line in the hierarchical word-decode scheme. When a single segment of each sub-word line is laid out across a plurality of physically separated blocks of cell arrays and shared by these blocks, for example, the plurality of blocks is considered to constitute a single column block.

The column-control unit 5 performs the CAS operation, i.e., makes an access to the indicated column address in the selected column block. This achieves a data exchange between the data buffer 4 and a sense amplifier of the indicated column address. The data buffer 4 receives data from the outside of the semiconductor memory device 1 to supply the data to the memory-cell circuit 7, or receives data from the memory-cell circuit 7 to supply the data to the outside of the semiconductor memory device 1.

In the present invention, selection of a column block is not always made with respect to only one column block corresponding to an indicated column address. As will be described later, all the column blocks are selected for the RAS operation when a next row address to be accessed is the same as the current row address. This achieves a consecutive read operation as in the related-art semiconductor memory device when the same row address continues to be accessed.

Figure 4:
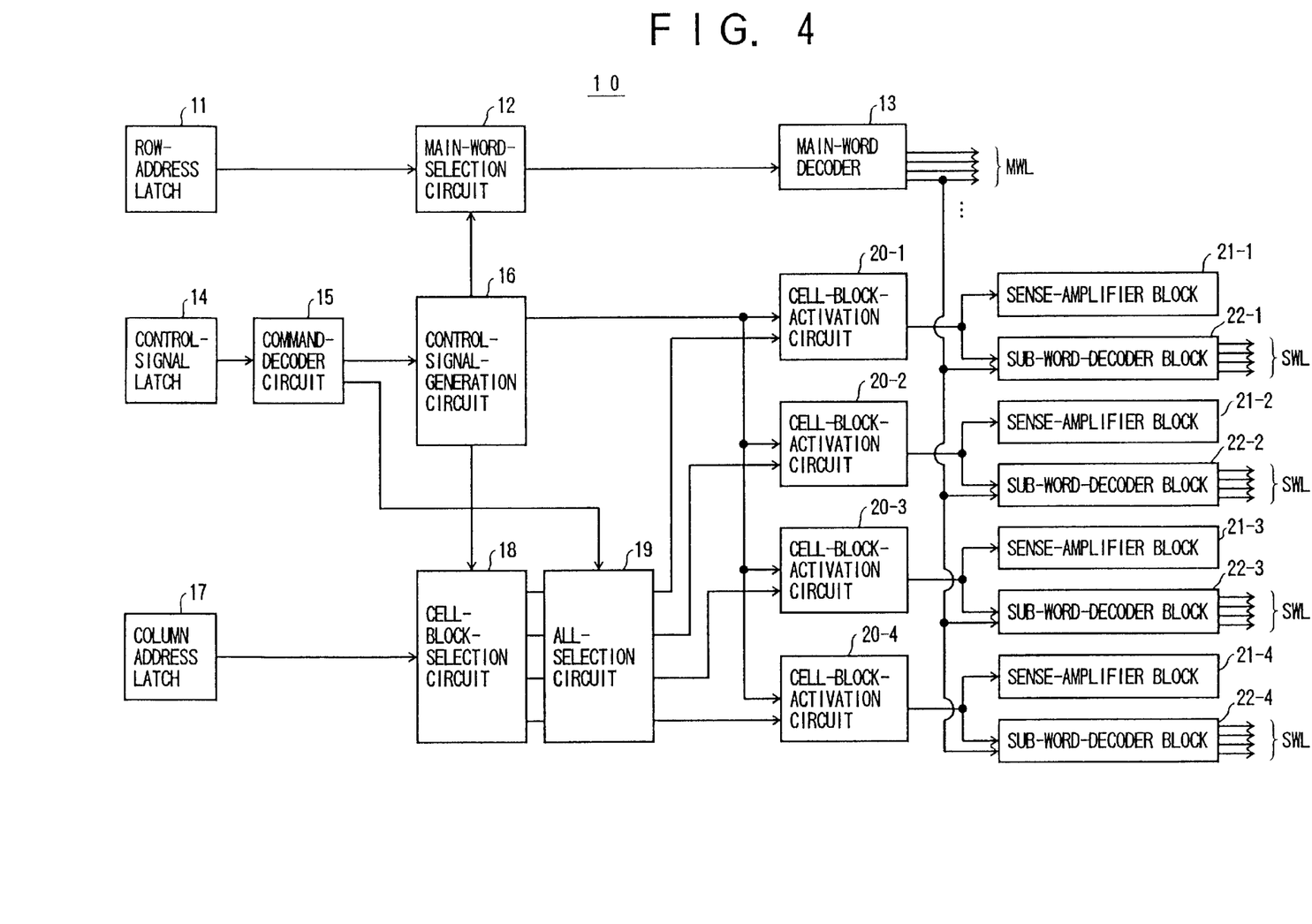
FIG. 4 is a block diagram of a relevant portion of the semiconductor memory device of FIG. 3 relating to a RAS operation according to a first embodiment of the sent invention.

FIG. 4 is a block diagram of a relevant portion of the semiconductor memory device 1 relating to the RAS operation according to a first embodiment of the present invention. In the semiconductor memory device 1 of FIG. 3, circuits relating to the CAS operation such as a column-decoder circuit are the same as those of the related art, and a description thereof will be omitted.

A RAS-operation-related portion 10 of FIG. 4 includes a row-address latch 11, a main-word-selection circuit 12, a main-word decoder 13, a control-signal latch 14, a command-decoder circuit 15, a control-signal-generation circuit 16, a column address latch 17, a cell-block-selection circuit 18, an all-selection circuit 19, cell-block-activation circuits 20-1 through 20-4, sense-amplifier blocks 21-1 through 21-4, and sub-word-decoder blocks 22-1 through 22-4.

A configuration of the RAS-operation-related portion 10 shown in FIG. 4 is basically the same as that of a related art circuit concerning the RAS operation, except that the all-selection circuit 19 is provided in the RAS-operation-related portion 10. The main-word decoder 13 corresponds to the main-word decoder 201 of FIG. 2, and the cell-block-selection circuit 18 is equivalent to the column-block-selection circuit 208 of FIG. 2. Further, each of the cell-block-activation circuits 20-1 through 20-4 corresponds to a respective pair of the sense-amplifier-control circuits 205 and the sub-word-decoder-control circuits 206 of FIG. 2. Each of the sense-amplifier blocks 21-1 through 21-4 corresponds to a respective one of the sense-amplifier blocks 204 of FIG. 2. Finally, each of the sub-word-decoder blocks 22-1 through 22-4 is equivalent to a respective set of the sub-word decoders 209 through 212 of FIG. 2. As can be seen, there are four column blocks in the example of FIG. 4. However, the number of column blocks is not limited to four, and can be any number.

The control-signal latch 14 supplies control signals (commands) to the command-decoder circuit 15 in order to give instructions regarding RAS operations and CAS operations. The command-decoder circuit 15 decodes the supplied control signals, and provides the control-signal-generation circuit 16 with results of the decoding. Based on the decoding result, the control-signal-generation circuit 16 controls the main-word-selection circuit 12, the cell-block-selection circuit 18, the all-selection circuit 19, and the cell-block-activation circuits 20-1 through 20-4.

The row-address latch 11 supplies a row address to the main-word-selection circuit 12. Under the control of the control-signal-generation circuit 16, the main-word-selection circuit 12 selects the main-word decoder 13 based on the provided row address. FIG. 4 shows only a selected main-word decoder 13 while a plurality of main-word decoders 13 are actually provided. The main-word decoder 13 then selectively activates one of the main-word lines MWL based on the row address.

The column address latch 17 supplies a column address to the cell-block-selection circuit 18. This column address is available at the time of the RAS operation. The cell-block-selection circuit 18 selects a cell block (column block) corresponding to the supplied column address, and selectively activates one of the cell-block-activation circuits 20-1 through 20-4. The selected one of the cell-block-activation circuits 20-1 through 20-4, which is under the control of the control-signal-generation circuit 16, selectively operates one of the sense-amplifier blocks 21-1 through 21-4 and one of the sub-word-decoder blocks 22-1 through 22-4

In the first embodiment of FIG. 4, the command-decoder circuit 15 checks whether a row address currently accessed is the same as a next row address to be accessed. Only when these successively accessed row addresses are the same, does the command-decoder circuit 15 supply an all-selection signal to the all-selection circuit 19 to select all the column blocks.

When successively accessed row addresses are different, the command-decoder circuit 15 does not send out the all-selection signal. In this case, the all-selection circuit 19 simply passes cell-block-selection signals from the cell-block-selection circuit 18 to the cell-block-activation circuits 20-1 through 20-4. That is, only in the column block selected by the cell-block-selection circuit 18, will the sub-word lines SWL be selectively activated to carry out the RAS operation.

When successively accessed row addresses are the same, i.e., when a next row address to be accessed is the same as the current row address, the all-selection circuit 19 selects all the cell-block-activation circuits 20-1 through 20-4 in response to the all-selection signal from the command-decoder circuit 15. This allows all the column blocks to undergo the RAS operation. That is, the sense-amplifier blocks 21-1 through 21-4 are activated in all the column blocks, and the sub-word-decoder blocks 22-1 through 22-4 are operated in all the column blocks to selectively activate the sub-word lines SWL. The all-selection circuit 19 is a simple logic circuit well within the scope of ordinary skill in the art, and a circuit configuration thereof will be omitted.

Figure 5A:
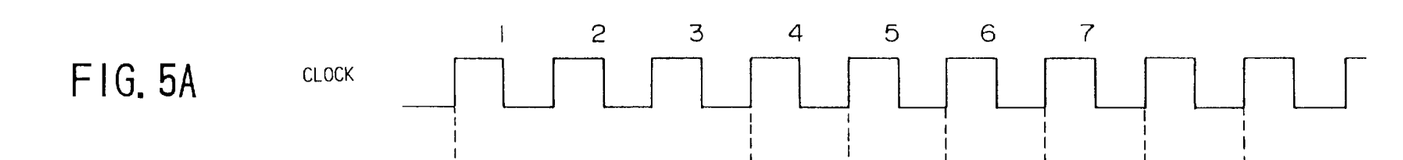
FIGS. 5A through 5D are timing charts showing the RAS operation of the first embodiment shown in FIG. 4.
Figure 5B:
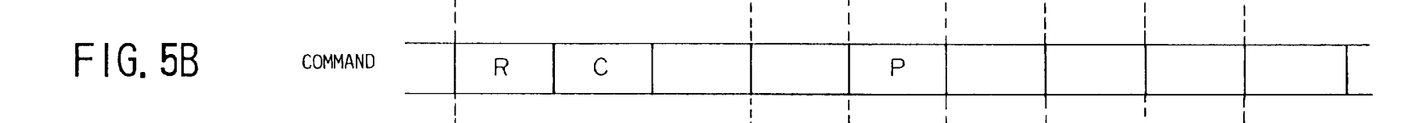

FIGS. 5A through 5D are timing charts showing the RAS operation of the first embodiment shown in FIG. 4. FIGS. 5A through 5D show a clock signal used as a synchronization signal of the semiconductor memory device 1, a command signal supplied to the semiconductor memory device 1, signals of the main-word lines and the sub-word-lines when successive accesses are made to the same row address, and signals of the main-word lines and the sub-word lines when the successive accesses are made to different row address, respectively. In FIG. 5B, R represents a command for requesting a RAS operation, and C represents a command for indicating a CAS operation. Further, the letter P designates a precharge command for request a reset operation. As shown in FIG. 5B, the command R and the command C are supplied at timings close to each other such as at successive clock timings.

Figure 5C:
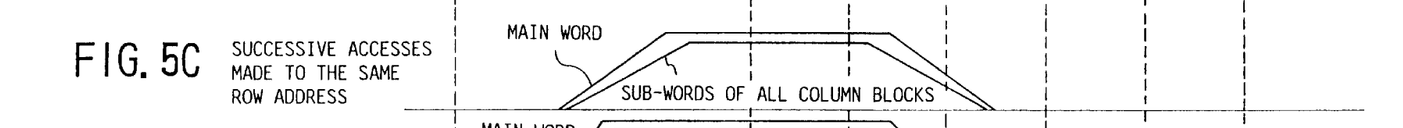
Figure 5D:
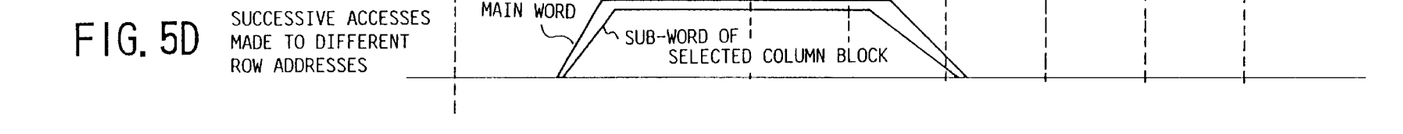

As shown in FIG. 5D, when successive accesses are directed to different row addresses, a selected main-word line MWL is turned to HIGH, and a selected sub-word line SWL in the selected column block is also turned to HIGH. Since the load to selectively drive the word lines is relatively small, the selected main-word line MWL and the selected sub-word line SWL are turned to HIGH at a high speed.

As shown in FIG. 5C, when successive accesses are directed to the same row addresses, a selected main-word line MWL is turned to HIGH, and a selected sub-word line SWL in all the column blocks is also turned to HIGH. Since the load to selectively drive the word lines is relatively large, the selected main-word line MWL and the selected sub-word line SWL are turned to HIGH at a relatively low speed. Since the sub-word lines SWL are activated in all the column blocks, however, only one activation of the RAS operation makes it possible to access consecutive column addresses.

In the first embodiment described above, the command-decoder circuit 15 checks whether a current row address is the same as a next row address, and controls the all-selection circuit 19 accordingly. This makes it possible to switch between a selective RAS operation with regard to a selected column block corresponding to an indicated column address and a full-scale RAS operation with regard to all the column blocks. When a selected column block is activated, speed of the RAS operation can be enhanced because of a reduction in the circuit load. On the other hand, when the same row address is to be accessed successively, it is sufficient for the RAS operation to be performed only once, thereby boosting a total operation speed.

In order to check whether a current row address and a next row address are the same, two types of RAS commands may be provided. Namely, a command RAS1 is used when a next row address is different, for example, and a command RAS2 is used when a next row address is the same. This achieves an easy check by the command-decoder circuit 15.

Figure 6:
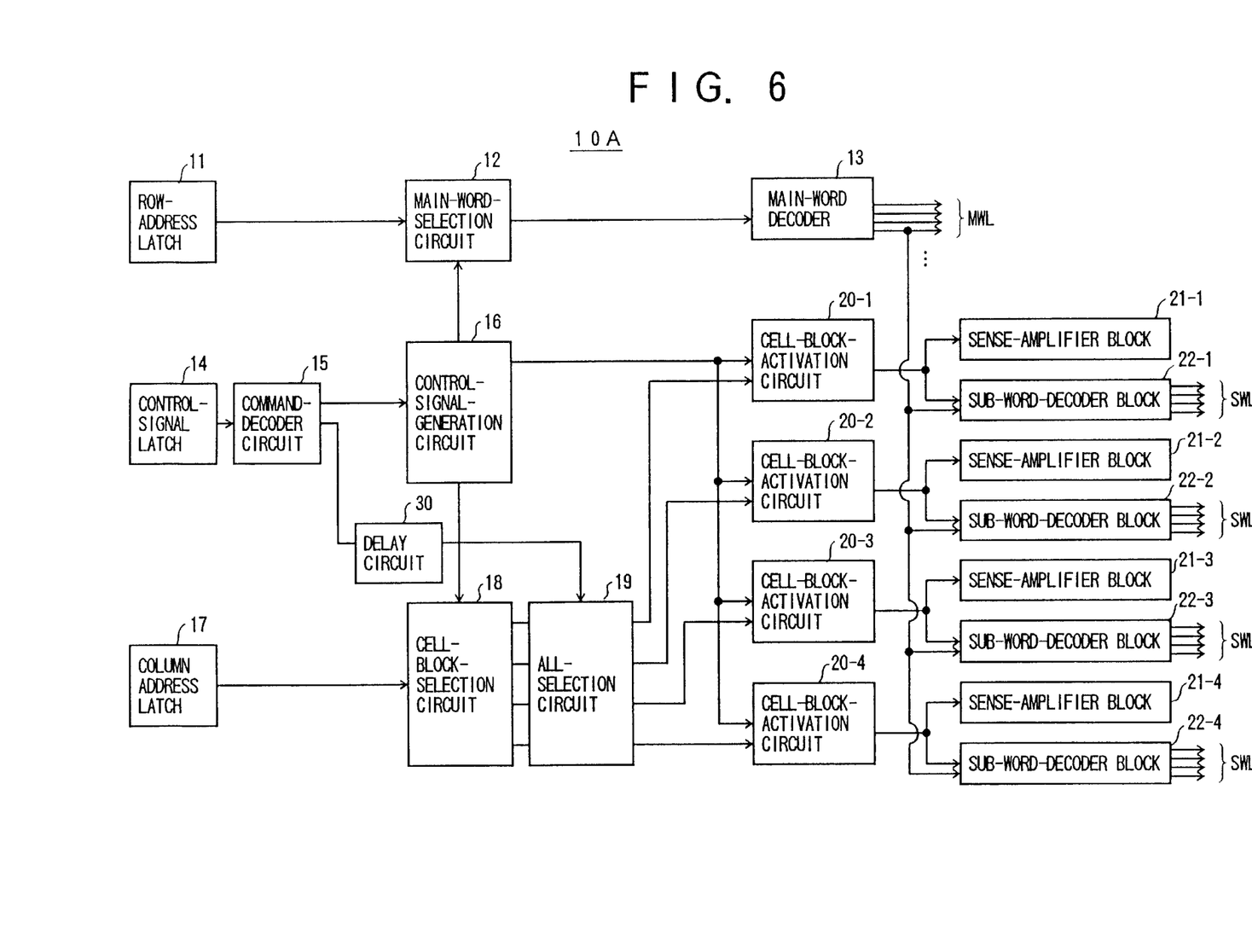
FIG. 6 ia block diagram of a relevant portion of the semiconductor memory device relating to the RAS operation according to a second embodiment of the present invention.

FIG. 6 is a block diagram of a relevant portion of the semiconductor memory device 1 relating to the RAS operation according to a second embodiment of the present invention. In FIG. 6, the same elements as those of FIG. 4 are referred to by the same numerals, and a description thereof will be omitted.

A RAS-operation-related portion 10A of FIG. 6 differs from the RAS-operation-related portion 10 of FIG. 4 in that a delay circuit 30 is newly added. The delay circuit 30 delays the all-selection signal from the command-decoder circuit 15 by a predetermined delay length, and supplies the delayed all-selection signal to the all-selection circuit 19.

When successively accessed row addresses are different, the command-decoder circuit 15 does not supply the all-selection signal. An operation in this case is the same as that of the first embodiment shown in FIG. 4. That is, the sub-word lines SWL are selectively activated in a column block which is selected by the cell-block-selection circuit 18, thereby performing the RAS operation only in the selected column block.

When successively accessed row addresses are the same, i.e., when a next row address to be accessed is the same as a current row address, the all-selection signal from the command-decoder circuit 15 is delayed by the delay circuit 30, and, then, is supplied to the all-selection circuit 19. Because of this delay, the all-selection circuit 19 selects all the cell-block-activation circuits 20-1 through 20-4 after the cell-block-selection circuit 18 selects one of the cell blocks. That is, the sub-word lines SWL are first selectively activated in a cell block selected by the cell-block-selection circuit 18, and, then, are selectively activated in all the cell blocks.

Figures 7A, 7B:
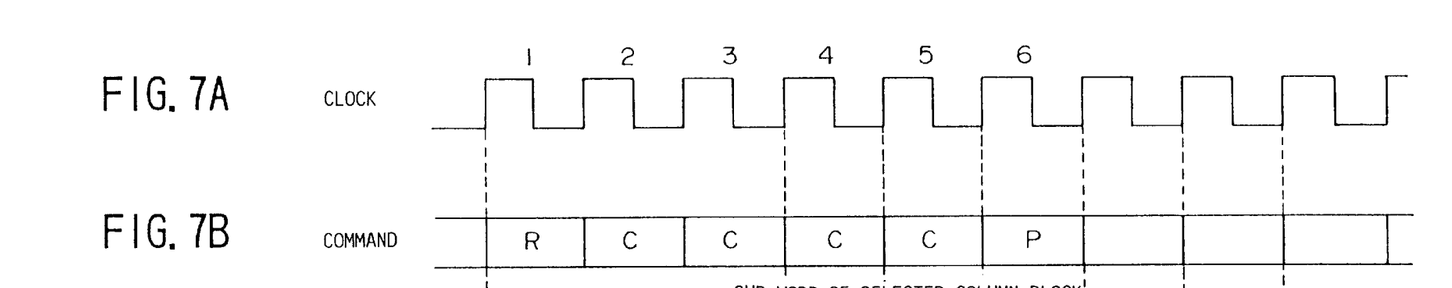
FIGS. 7A through 7C are timing charts showing the RAS operation of the second embodiment shown in FIG. 6.
Figure 7C:
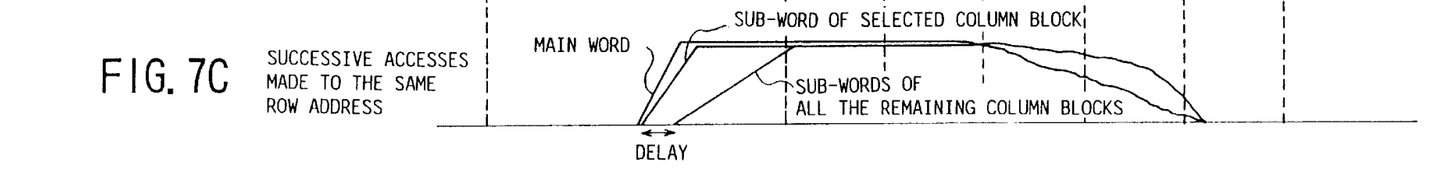

FIGS. 7A through 7C are timing charts showing the RAS operation of the second embodiment shown in FIG. 6. FIGS. 7A through 7C show a clock signal used as a synchronization signal of the semiconductor memory device 1, a command signal supplied to the semiconductor memory device 1, and signals of the main-word lines and the sub-word-lines when successive accesses are made to the same row address, respectively.

As shown in FIG. 7C, a selected main-word lines MWL is first turned to HIGH, and, at the same time, a selected sub-word line is turned to HIGH in a selected column block. Since the load to selectively drive the word lines is relatively small, the selected main-word line MWL and the selected sub-word line SWL rise to HIGH at a high speed. After a predetermined length of delay, selected sub-word lines SWL are turned to HIGH in all the remaining column blocks. The load of selective activation is relatively large in this case, so that the sub-word lines SWL rise at a relatively slow speed. Since the selected sub-word line SWL has been already changed to HIGH with respect to a first column block to be accessed, however, a relatively slow rise in the remaining column blocks does not constitute any problem. Further, since all the sub-word lines SWL are selectively activated in all the column blocks, only one activation of the RAS operation makes it possible to access consecutive column addresses.

In the second embodiment described above, when the RAS operation is carried out with respect to all the column blocks, a sub-word line SWL is selectively activated in a column block selected according to an indicated column address before selective activation of sub-word lines SWL is performed in all the remaining column blocks. This makes it possible to perform the RAS operation at a high speed. Further, since only one activation of the RAS operation is sufficient, total operation speed is enhanced.

Figure 8:
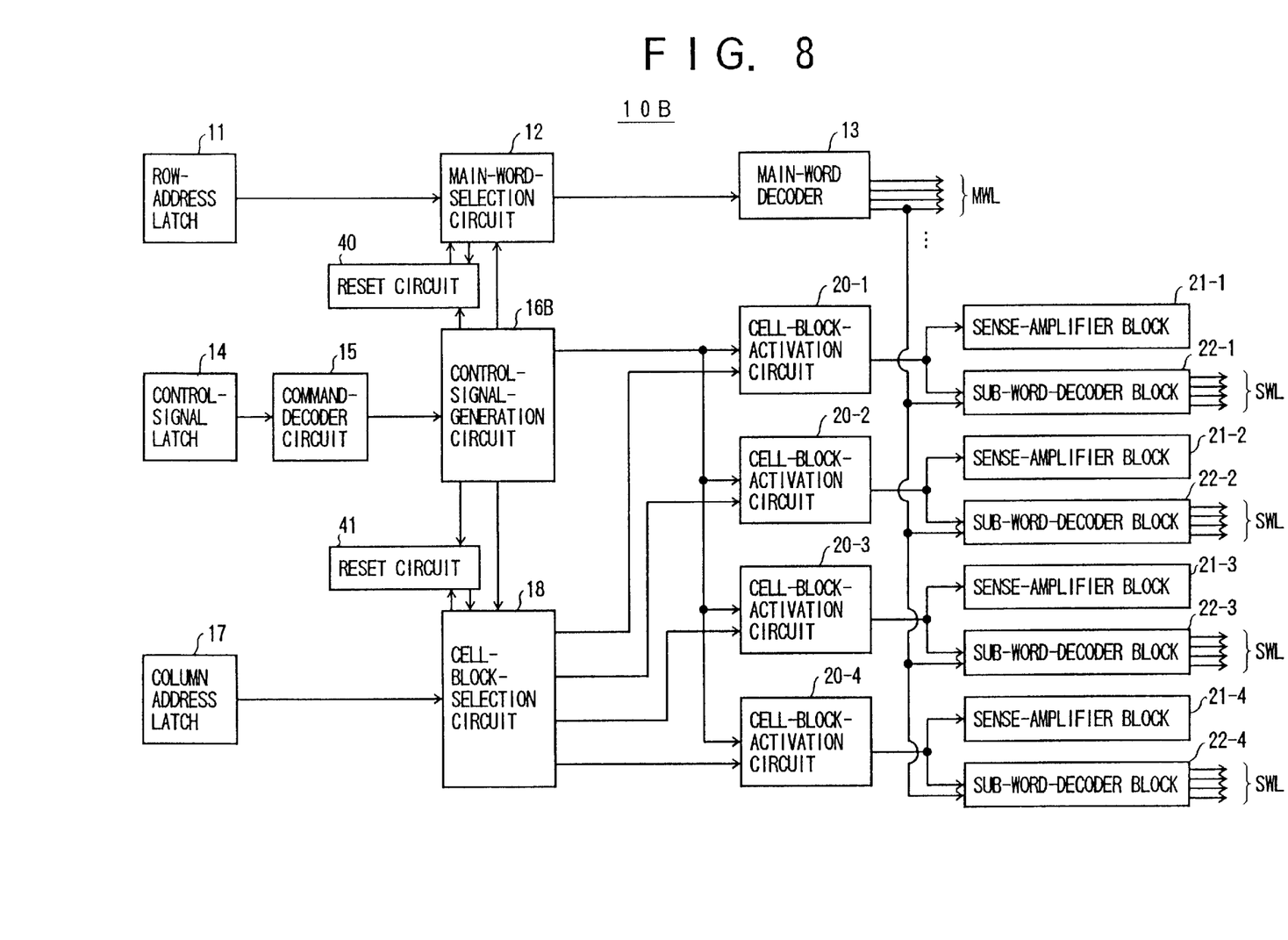
FIG. 8 is a block diagram of a relevant portion of the semiconductor memory device relating to the RAS operation according to a third embodiment of the present invention.

FIG. 8 is a block diagram of a relevant portion of the semiconductor memory device 1 relating to the RAS operation according to a third embodiment of the present invention. In FIG. 8, the same elements as those of FIG. 4 are referred to by the same numerals, and a description thereof will be omitted.

A RAS-operation-related portion 10B of FIG. 8 differs from the RAS-operation-related portion 10 of FIG. 4 in that reset circuits 40 and 41 are additionally provided, wherein the control-signal-generation circuit 16B controls the reset circuits 40 and 41. Further, the RAS-operation-related portion 10B of FIG. 8 does not include the all-selection circuit 19 of FIG. 4.

In general, semiconductor memory devices receive a precharge command to precharge bit lines and internal data buses and to reset a selected main-word line MWL and sub-word lines SWL. Such a reset operation can be automatically activated without externally providing a precharge command if a signal corresponding to the precharge command is internally generated. If a reset operation is internally activated, a high speed operation of the device is attainable. An example of such a scheme is disclosed in Japanese Patent Application No.9-145406 by inventors of the present invention.

The reset circuits 40 and 41 are provided for the purpose of such an internal reset operation. When the main-word-selection circuit 12 selects one of the main-word lines, the reset circuit 40 resets the main-word-selection circuit 12 at the end of a predetermined time period after the selection of the main-word line. This operation deactivates the selected one of the main-word lines MWL. By the same token, when the cell-block-selection circuit 18 selects a column block, the reset circuit 41 resets the cell-block-selection circuit 18 upon the passage of a predetermined time period after the selection of the column block. This deactivates the sub-word lines SWL.

In a configuration having the reset circuits 40 and 41 for automatic reset operations, the control-signal-generation circuit 16B prevents the reset circuit 40 from resetting the main-word-selection circuit 12 when successive accesses are directed to the same row address. That is, when a next row address to be accessed is the same as a current row address, the main-word-selection circuit 12 is not reset, and holds the selected main-word line MWL at a HIGH level. Only when a newly supplied command indicates a change in the row address, will the control-signal-generation circuit 16B allow the reset circuit 40 to reset the main-word-selection circuit 12, thereby deactivating the main-word line MWL.

When successive accesses are directed to different row addresses, the reset operation is performed as usual, so that the selected main-word line MWL is deactivated upon the passage of the predetermined time period after selective activation.

Figure 9A:
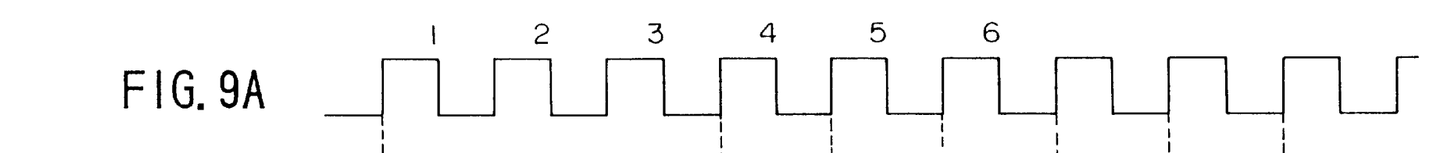
FIGS. 9A through 9C are timing charts showing the RAS operation 4 the third embodiment shown in FIG. 8.
Figure 9B:
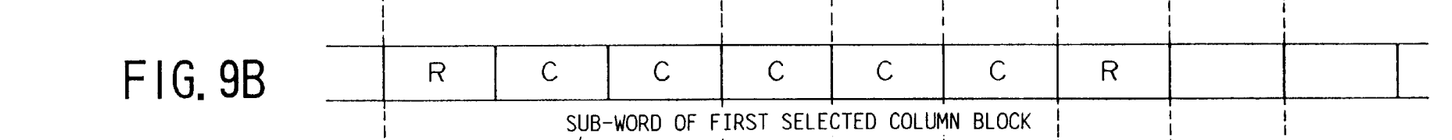
Figure 9C:
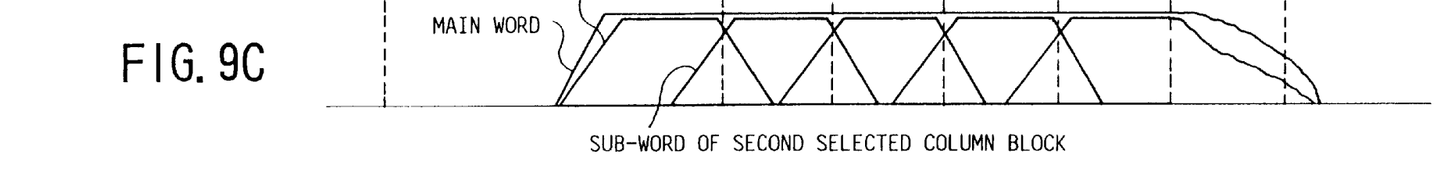

FIGS. 9A through 9C are timing charts showing the RAS operation of the third embodiment shown in FIG. 8. FIGS. 9A through 9C show a clock signal used as a synchronization signal of the semiconductor memory device 1, a command signal supplied to the semiconductor memory device 1, and signals of the main-word lines and the sub-word-lines when successive accesses are made to the same row address, respectively.

As shown in FIG. 9C, a selected main-word lines MWL is first turned to HIGH, and, at the same time, a selected sub-word line SWL is turned to HIGH in a first selected column block. Since the load to selectively drive the word lines is relatively small, the selected main-word line MWL and the selected sub-word line SWL rise to HIGH at a high speed. After a predetermined time period, the selected sub-word line SWL is reset by the reset circuit 41. In the same manner, the sub-word lines SWL are successively turned to HIGH and reset after a predetermined time period in successively selected column blocks.

In this manner, when the same row address is successively accessed, the sub-word lines SWL are successively activated while the selected main-word line MWL is kept in an activated state. This allows indicated column addresses to be successively accessed. When the selected main-word line MWL and the last sub-word line SWL are deactivated, a fast reduction in signal levels can be achieved because the load of activation has become sufficiently small by this point of time.

In the third embodiment described above, the reset circuits perform automatic reset operations of the main-word lines and the sub-word lines without needing a precharge command to be externally supplied. In such a configuration, the reset circuits are prevented from operating when the same row address is to be successively accessed. Prevention of the reset operations results in the selectively activated main-word line being maintained at an activated level. Because of this, the main-word lines need not be turned to HIGH each time the same row address is successively accessed, thereby enhancing total operation speed.

Figure 10:
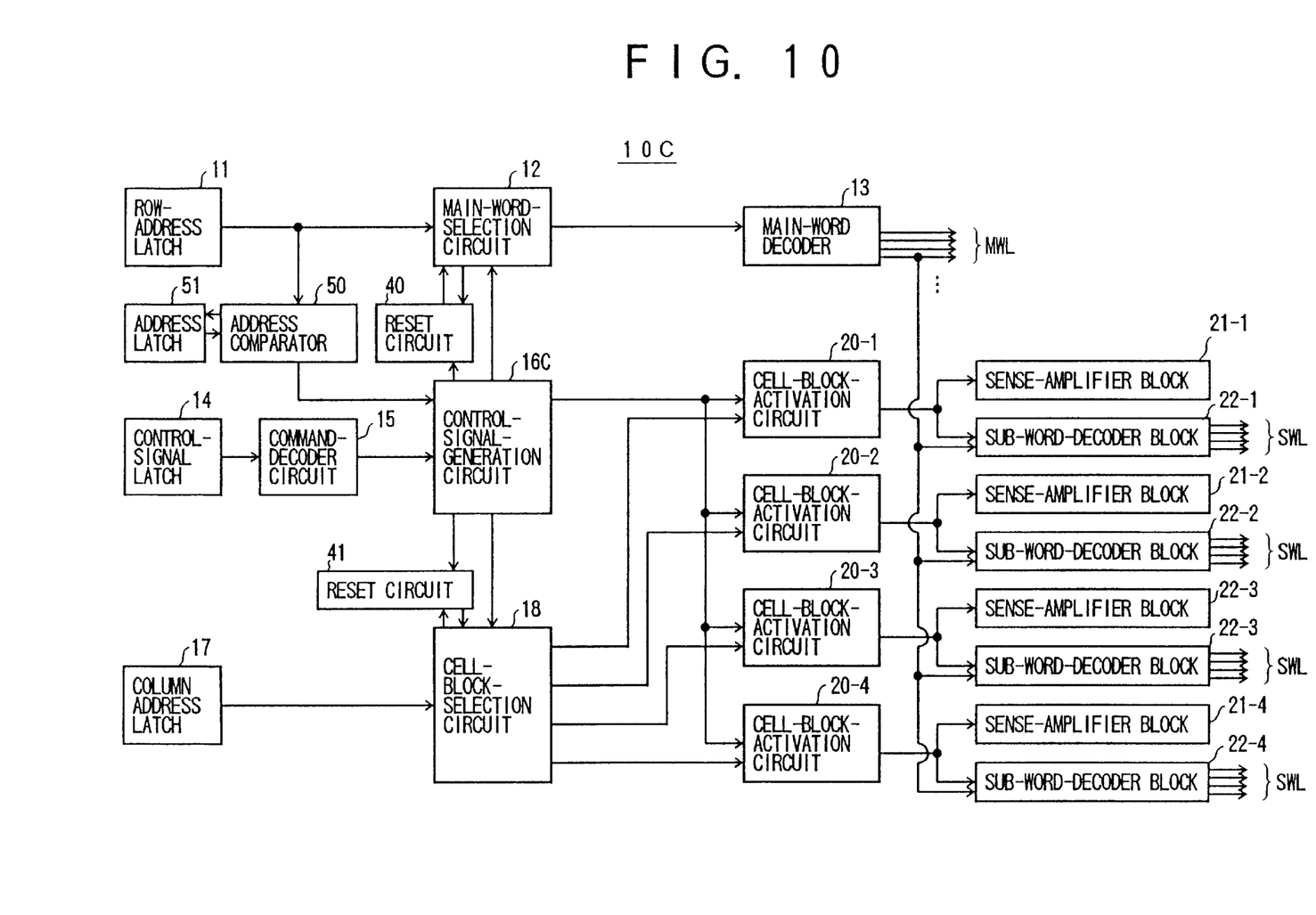
FIG. 10 is a block diagram of a relevant portion of the semiconductor memory device relating to the RAS operation according to a fourth embodiment of the present invention.

FIG. 10 is a block diagram of a relevant portion of the semiconductor memory device 1 relating to the RAS operation according to a fourth embodiment of the present invention. In FIG. 10, the same elements as those of FIG. 8 are referred to by the same numerals, and a description thereof will be omitted.

A RAS-operation-related portion 10C of FIG. 10 differs from the RAS-operation-related portion 10B of FIG. 8 in that a address comparator 50 and a address latch 51 are additionally provided. In the first through third embodiments previously described, different RAS commands are provided between successive accesses to the same row address and successive accesses to different row addresses, and operations are switched by decoding the supplied RAS commands. In the fourth embodiment, on the other hand, the address latch 51 stores a row address of a previous RAS operation, and the address comparator 50 compares a current row address with the previous row address. When the two row addresses are the same, the address comparator 50 informs the control-signal-generation circuit 16C of the address match.

When successive accesses are directed to the same row address, the control-signal-generation circuit 16C prevents the reset circuit 40 from performing a reset operation, thereby holding the selected main-word line MWL at a HIGH level. Only when a newly supplied command indicates a change in the row address, will the control-signal-generation circuit 16C allow the reset circuit 40 to reset the main-word-selection circuit 12, thereby deactivating the main-word line MWL. At the same time, the control-signal-generation circuit 16C controls the main-word-selection circuit 12 to select a next one of the main-word lines MWL.

Figure 11A:
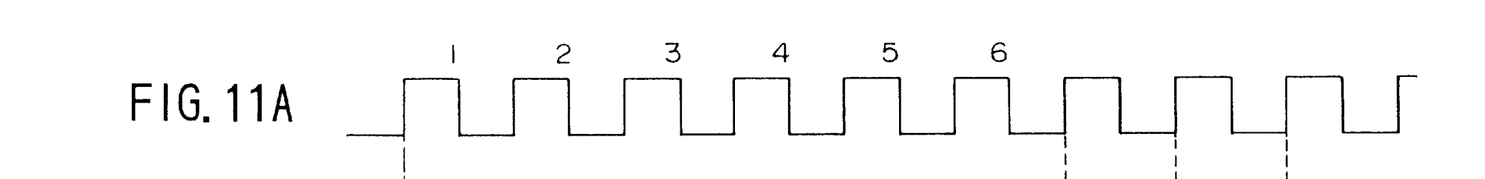
FIGS. 11A through 11C are timing charts showing the RAS operation of the third embodiment shown in FIG. 10.
Figure 11B:
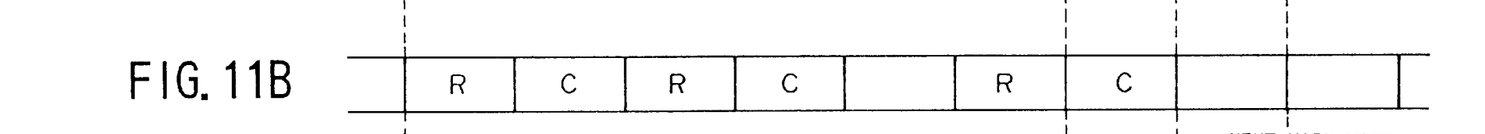
Figure 11C:
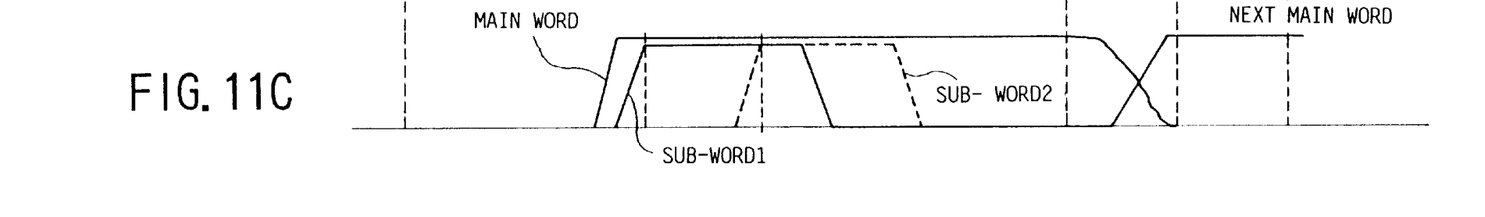

FIGS. 11A through 11C are timing charts showing the RAS operation of the third embodiment shown in FIG. 10. FIGS. 11A through 11C show a clock signal used as a synchronization signal of the semiconductor memory device 1, a command signal supplied to the semiconductor memory device 1, and signals of the main-word lines and the sub-word-lines when successive accesses are made to the same row address, respectively.

As shown in FIG. 11C, a selected main-word lines MWL is first turned to HIGH, and, at the same time, a selected sub-word line SWL is turned to HIGH in a first selected column block. Since the load to selectively drive the word lines is relatively small in this case, the selected main-word line MWL and the selected sub-word line SWL rise to HIGH at a high speed. After a predetermined time period, the selected sub-word line SWL is reset by the reset circuit 41. In the same manner, the sub-word lines SWL are successively turned to HIGH and reset after a predetermined time period in successively selected column blocks.

After the last selected sub-word line SWL is deactivated, the selected main-word line MWL is also deactivated. At the time when the selected main-word line MWL is deactivated, the last selected sub-word line SWL is already unselected, so that activation of a next selected main-word line MWL can be carried out concurrently with the deactivation of the selected main-word line MWL.

In the fourth embodiment described above, the reset circuits perform automatic reset operations of the main-word lines and the sub-word lines without needing a precharge command to be externally supplied. In this configuration, a current row address is compared with a previous row address so as to check whether the same row address is successively accessed. When the successive accesses are directed to the same row address, the operation of the reset circuit is stopped to maintain a selectively activated main-word line in an activated state. This eliminates a need to repeatedly activate a main-word line each time access is made to the same row address, thereby stepping up total operation speed. Further, deactivation of a selected main-word line can be conducted concurrently with activation of a next selected main-word line. This achieves a reduction in the time period required for switching the main-word lines.

Further, the present invention is not limited to these embodiments, but variations and modifications may be made without departing from the scope of the present invention.

What is claimed is:

1. A semiconductor memory device which employs a hierarchical word-decode scheme for word selection, said semiconductor memory device comprising:

sub-word lines provided for each of column blocks;

a control circuit selecting one of said column blocks corresponding to a currently accessed column address in a first case where a currently accessed row address is different from a successively accessed row address, and selecting all of said column blocks in a second case where said currently accessed row address is the same as said successively accessed row address; and a sub-word decoder selectively activating said sub-word lines with respect to all of one or more column blocks selected by said control circuit.

2. The semiconductor memory device as claimed in claim 1, wherein said control circuit comprises:

a command-decoder circuit checking whether a supplied command is a first command for requesting a row access in said first case or a second command for requesting a row access in said second case;

a column-block-selection circuit selecting said one of said column blocks in said first case; and an all-selection circuit selecting said all of said column blocks in said second case.

3. The semiconductor memory device as claimed in claim 1, wherein said control circuit first selects said one of said column blocks a predetermined time period before selecting said all of said column blocks in said second case.

4. The semiconductor memory device as claimed in claim 3, wherein said control circuit comprises:

a command-decoder circuit checking whether a supplied command is a first command for requesting a row access in said first case or a second command for requesting a row access in said second case;

a column-block-selection circuit selecting said one of said column blocks in said first case and said second case; and an all-selection circuit selecting said all of said column blocks in said second case a predetermined time period after said one of said column block is selected.

5. A semiconductor memory device which employs a hierarchical word-decode scheme for word selection, said semiconductor memory device comprising:

a plurality of main-word lines;

a first reset circuit performing a reset operation resetting a selected one of said main-word lines a predetermined time period after said selected one of said main-word lines is activated;

sub-word lines provided for each of column blocks;

a column-block-selection circuit selecting one of said column blocks corresponding to a currently accessed column address so as to selectively activate said sub-word lines with respect to said one of said column blocks; and a control circuit controlling said first reset circuit to perform the reset operation in a first case where a currently accessed row address is different from a successively accessed row address, and controlling said first reset circuit not to perform the reset operation in a second case where said currently accessed row address is the same as said successively accessed row address.

6. The semiconductor memory device as claimed in claim 5, further comprising a second reset circuit which resets selected one of said sub-word lines a predetermined time period after said selected one of said sub-word lines is activated.

7. The semiconductor memory device as claimed in claim 5, wherein said control circuit comprises a command-decoder circuit checking whether a supplied command is a first command for requesting a row access in said first case or a second command for requesting a row access in said second case.

8. The semiconductor memory device as claimed in claim 5, wherein said control circuit comprises:

a latch which holds a row address;

a comparison circuit comparing a row address of a previous access held by said latch with a row address of a current access to check whether said row address of a previous access is the same as said row address of a current access.

9. The semiconductor memory device as claimed in claim 8, wherein a selected one of said main-word lines is deactivated concurrently with activation of a next selected one of said main-word lines.

* * * * *